US012696560B2

(12) United States Patent
Liu et al.

(10) Patent No.: US 12,696,560 B2
(45) Date of Patent: Jul. 28, 2026

(54) LINER LAYER ALONG ABSORPTION STRUCTURE OF IR SENSOR

(71) Applicant: Taiwan Semiconductor Manufacturing Company, Ltd., Hsinchu (TW)

(72) Inventors: Po-Chun Liu, Hsinchu City (TW); Yi-Shin Chu, Hsinchu City (TW); Sin-Yi Jiang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 378 days.

(21) Appl. No.: 18/360,115

(22) Filed: Jul. 27, 2023

(65) Prior Publication Data

US 2024/0355843 A1 Oct. 24, 2024

Related U.S. Application Data

(60) Provisional application No. 63/497,489, filed on Apr. 21, 2023.

(51) Int. Cl.
H10F 39/00 (2025.01)
H10F 39/18 (2025.01)

(52) U.S. Cl.
CPC ....... H10F 39/8033 (2025.01); H10F 39/014 (2025.01); H10F 39/184 (2025.01)

(58) Field of Classification Search
CPC .. H10F 39/8033; H10F 39/014; H10F 39/184; H10F 39/189; H10F 39/802; H10F 39/807; H10F 39/811
See application file for complete search history.

(56) References Cited

U.S. PATENT DOCUMENTS

| | | |
|---|---|---|
| 2010/0258893 A1 | 10/2010 | Sawada |
| 2018/0012917 A1 | 1/2018 | Na et al. |
| 2020/0105812 A1* | 4/2020 | Sze ..................... H10F 39/1843 |
| 2021/0098524 A1 | 4/2021 | Liu et al. |
| 2021/0343762 A1* | 11/2021 | King ................... H10F 39/8037 |
| 2021/0375959 A1* | 12/2021 | Hung ................. H10F 39/8033 |
| 2022/0246784 A1 | 8/2022 | Shih et al. |
| 2022/0328556 A1 | 10/2022 | Liu et al. |

(Continued)

FOREIGN PATENT DOCUMENTS

JP 2010251388 A 11/2010

*Primary Examiner* — Yara B Green
*Assistant Examiner* — Akhee Sarker-Nag
(74) *Attorney, Agent, or Firm* — Eschweiler & Potashnik, LLC

(57) ABSTRACT

Various embodiments of the present disclosure are directed towards an integrated chip including a substrate comprising a first semiconductor material and a recess in a top surface of the substrate. An absorption structure is disposed within the recess and comprising a second semiconductor material different from the first semiconductor material. The absorption structure has a first doping type. A vertical well region is disposed within the substrate and underlies the absorption structure. The vertical well region has a second doping type different from the first doping type. A liner layer is disposed between the absorption structure and the substrate. The liner layer comprises the second semiconductor material and separates the vertical well region from the absorption structure.

20 Claims, 11 Drawing Sheets

100

(56) References Cited

U.S. PATENT DOCUMENTS

| | | |
|---|---|---|
| 2023/0027354 A1 | 1/2023 | Liu et al. |
| 2023/0066085 A1 | 3/2023 | Fang et al. |
| 2023/0207719 A1 | 6/2023 | Chien et al. |
| 2023/0369360 A1 | 11/2023 | Hung et al. |
| 2024/0145499 A1* | 5/2024 | Liu .................... H10F 39/8033 |

* cited by examiner

100

200a

200b

200c

300a

300b

1200

1300

1400

1500

1700 —

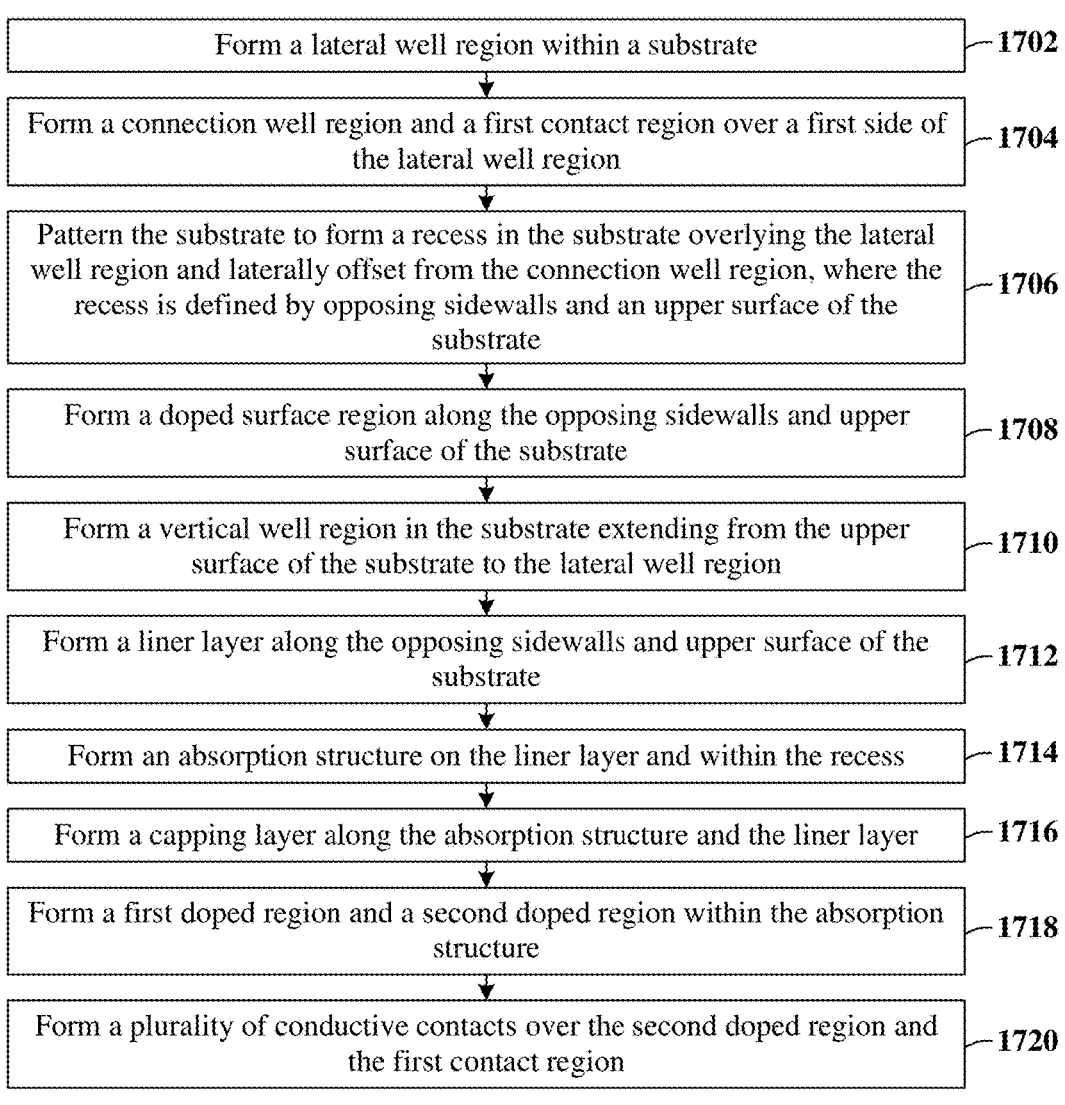

| Form a lateral well region within a substrate | — 1702 |

| Form a connection well region and a first contact region over a first side of the lateral well region | — 1704 |

| Pattern the substrate to form a recess in the substrate overlying the lateral well region and laterally offset from the connection well region, where the recess is defined by opposing sidewalls and an upper surface of the substrate | — 1706 |

| Form a doped surface region along the opposing sidewalls and upper surface of the substrate | — 1708 |

| Form a vertical well region in the substrate extending from the upper surface of the substrate to the lateral well region | — 1710 |

| Form a liner layer along the opposing sidewalls and upper surface of the substrate | — 1712 |

| Form an absorption structure on the liner layer and within the recess | — 1714 |

| Form a capping layer along the absorption structure and the liner layer | — 1716 |

| Form a first doped region and a second doped region within the absorption structure | — 1718 |

| Form a plurality of conductive contacts over the second doped region and the first contact region | — 1720 |

Fig. 17

LINER LAYER ALONG ABSORPTION STRUCTURE OF IR SENSOR

REFERENCE TO RELATED APPLICATION

This application claims the benefit of U.S. Provisional Application No. 63/497,489, filed on Apr. 21, 2023, the contents of which are hereby incorporated by reference in their entirety.

BACKGROUND

Integrated chips with photonic devices are found in many modern-day electronic devices. For example, photonic devices comprising image sensors are used in cameras, video recorders, and other types of photographic systems to capture images. Photonic devices have also found widespread use in other applications such as depth sensors, which are used to determine a distance between a sensor and a target object in a time-of-flight (TOF) system. Depth sensors for TOF systems can be used in smart phones (e.g., for facial recognition), automobiles, drones, robotics, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 illustrates a flow diagram of some embodiments of a method of forming an integrated chip comprising an image sensor having a liner layer disposed along opposing sidewalls and a lower surface of an absorption structure.

DETAILED DESCRIPTION

Figure 1:
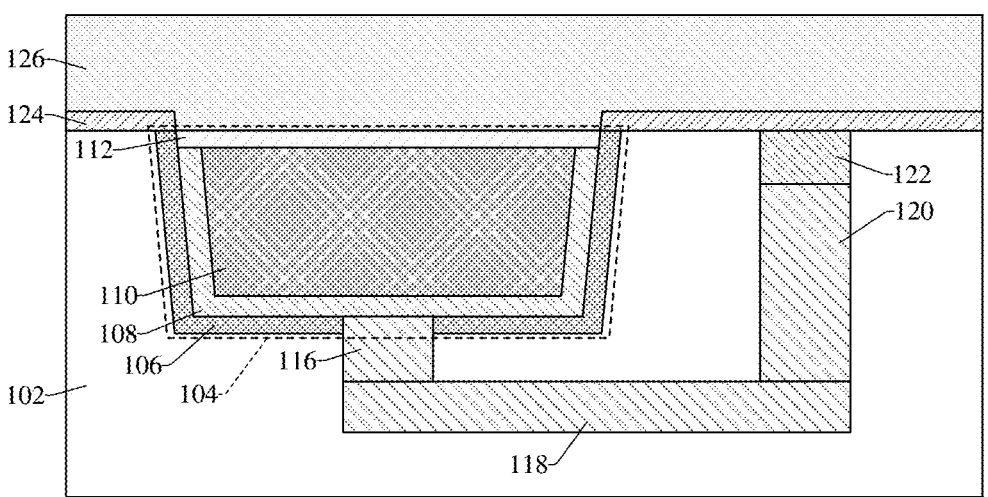
FIG. 1 illustrates a cross-sectional view of some embodiments of an integrated chip comprising an image sensor having a liner layer disposed along opposing sidewalls and a lower surface of an absorption structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may include an image sensor device that can detect electromagnetic radiation. For example, the image sensor device is configured to generate electrical signals that correspond to received incident electromagnetic radiation. In near infrared (NIR) applications, the image sensor device may comprise a germanium absorption structure recessed into a silicon substrate. Germanium has a higher absorption in the NIR spectrum compared to silicon due to its small bandgap compared to silicon. This increases a performance of the image sensor device in depth sensing application such as time-of-flight (TOF) depth sensing.

The image sensor device further comprises a vertical well region disposed in the substrate below the absorption structure, where the vertical well region abuts or contacts the absorption structure. The absorption structure has a first doping type (e.g., p-type) and/or comprises one or more doped regions having the first doping type. The vertical well region has a second doping type (e.g., n-type) and is configured to facilitate generation and/or readout of electrical signals corresponding to received incident electromagnetic radiation. Due to the vertical well region abutting or contacting the absorption structure, dopants (e.g., boron) from the absorption structure may be prone to diffusing out of the absorption structure into the vertical well region. This may induce a high resistance between the vertical well region and the absorption structures, which can impede the flow of current in the vertical well region. As a result, dark current may be reduced. However, the diffusion of dopants also mitigates a flow and/or generation of photocurrent by the image sensor device. Consequently, an ability to convert the incident electromagnetic radiation into measurable electrical current is decreased, thereby decreasing a quantum efficiency (QE) of the image sensor device and decreasing an ability to accurately perform depth sensing. Further, diffusion of dopants from the absorption structure may increase when the image sensor device is exposed to high temperatures (e.g., during fabrication and/or operation of the image sensor device) such that a reliability and endurance of the image sensor device is decreased.

Various embodiments of the present disclosure are directed towards an image sensor device having a liner layer disposed between an absorption structure (e.g., comprising germanium) and a substrate (e.g., comprising silicon). The absorption structure is recessed into the substrate and has a first doping type (e.g., p-type). A vertical well region is disposed within the substrate below the absorption structure and has a second doping type (e.g., n-type). The liner layer is disposed along a lower surface and opposing sidewalls of the absorption structure. The liner layer separates the absorption structure from the vertical well region. Further, the liner layer comprises an undoped semiconductor material (e.g., intrinsic germanium) or has a relatively low doping concentration of the first doping type (e.g., a lower doping concentration than that of the absorption structure). By virtue of the liner layer being disposed between the absorption structure and the vertical well region and being undoped or having the relatively low doping concentration, the liner layer mitigates diffusion of dopants from the absorption structure to the vertical well region. Mitigating diffusion of dopants from the absorption structure increases a QE of the image sensor device, thereby improving a performance of the image sensor device.

FIG. 1 illustrates a cross-sectional view 100 of some embodiments of an integrated chip comprising an image sensor 104 having a liner layer 108 disposed along opposing sidewalls and a lower surface of an absorption structure 110.

The integrated chip includes the image sensor 104 disposed within a substrate 102. The substrate 102 is or comprises a first semiconductor material and comprises one or more surfaces defining a recess extending into a top surface of the substrate 102. The image sensor 104 comprises the absorption structure 110 disposed in the recess of the substrate 102, and further comprises the liner layer 108 disposed between the absorption structure 110 and the substrate 102. The absorption structure 110 and the liner layer 108 comprise a second semiconductor material. In some embodiments, the liner layer 108 and the absorption structure 110 are embedded in the substrate 102. For example, the liner layer 108 is disposed along sidewalls and a horizontal surface of the substrate 102. The first semiconductor material of the substrate 102 is different from the second semiconductor material of the liner layer 108 and the absorption structure 110. In some embodiments, the first semiconductor material may be or comprise silicon and the second semiconductor material may be or comprise germanium. In various embodiments, the absorption structure 110 comprises dopants (e.g., boron) comprising a first doping type (e.g., p-type).

A doped surface region 106 is disposed within the substrate 102 along the one or more surfaces of the substrate 102 defining the recess. The doped surface region 106 comprises the first doping type (e.g., p-type) and may passivate defects between the substrate 102 and the liner layer 108 (e.g., due to a mismatch of lattice constants between the substrate 102 and the liner layer 108). Further, a vertical well region 116 is disposed within the substrate 102 below the absorption structure 110. The vertical well region 116 abuts sides of the doped surface region 106 and a lower surface of the liner layer 108. A lateral well region 118 underlies the vertical well region 116 and continuously extends from the vertical well region 116 to a connection well region 120. A first contact region 122 overlies the connection well region 120. In various embodiments, the vertical well region 116, the lateral well region 118, the connection well region 120, and the first contact region 122 comprise a second doping type (e.g., n-type) different from first doping type (e.g., p-type).

A capping layer 112 overlies the absorption structure 110 and the liner layer 108. The capping layer 112 comprises the first semiconductor material (e.g., silicon) and is configured to protect the absorption structure 110 and/or the liner layer 108 during manufacturing of the image sensor 104. A dielectric layer 124 and a dielectric structure 126 overlie the top surface of the substrate 102.

During operation of the image sensor 104, incident electromagnetic radiation (e.g., near infrared (NIR) radiation) may strike the absorption structure 110. The incident electromagnetic radiation may cause an electron-hole pair to form within the absorption structure 110. In various embodiments, formation of the electron-hole pair may release an electron that then may flow to the vertical well region 116, for example, due to bias voltages applied to the absorption structure 110 and/or the first contact region 122. Thus, the image sensor 104 is configured to convert the incident electromagnetic radiation into electrical signals. The absorption structure 110 and/or the liner layer 108 comprising the second semiconductor material (e.g., germanium) increases absorption of targeted electromagnetic radiation within an NIR bandwidth (e.g., electromagnetic radiation having wavelength within a range of about 800 nanometers (nm) to 2,500 nm). This, in part, may occur because a band gap of the absorption structure 110 and/or the liner layer 108 is smaller than that of silicon (e.g., less than 1 eV). In various embodiments, the image sensor 104 may comprise or be a photodiode (e.g., a PN photodiode, a PIN photodiode, an avalanche photodiode, or the like), a depth sensor for a time-of-flight (TOF) system, or the like.

In various embodiments, defects (e.g., dislocation defects) may be present in the liner layer 108 and/or the absorption structure 110 due to a mismatch of lattice contacts between the substrate 102 and the liner layer 108 and/or the absorption structure 110. These defects may contribute to the generation (e.g., thermal generation) of free charge carriers (e.g., free electrons that form in the absorption structure 110) that can induce dark current in the image sensor 104. The absorption structure 110 comprises dopants (e.g., boron) having the first doping type (e.g., p-type), such that the absorption structure 110 may, for example, be hole rich and may passivate the defects, thereby suppressing the dark current from the free charge carriers (e.g., electrons) and increasing an overall performance of the image sensor 104.

The liner layer 108 is disposed directly between the absorption structure 110 and the vertical well region 116, thereby separating the absorption structure 110 from the vertical well region 116 by a non-zero distance. By separating the absorption structure 110 from the vertical well region 116, the liner layer 108 mitigates diffusion of dopants (e.g., boron) from the absorption structure 110 to the vertical well region 116, thereby increasing a QE of the image sensor 104. For example, the dopants (e.g., boron) disposed within the absorption structure 110 may have a high likelihood to diffuse out of the absorption structure 110. In various embodiments, the liner layer 108 is undoped or comprises the second doping type (e.g., p-type) with a relatively low doping concentration (e.g., lower than a doping concentration of the absorption structure 110). By virtue of a layout, material, doping concentration, and/or thickness of the liner layer 108, the liner layer 108 is configured to reduce diffusion of the dopants from the absorption structure 110 to the vertical well region 116. This facilitates sufficiently suppressing dark current while increasing the QE of the image sensor 104. Accordingly, an overall performance of the integrated chip is increased.

Figure 2A:
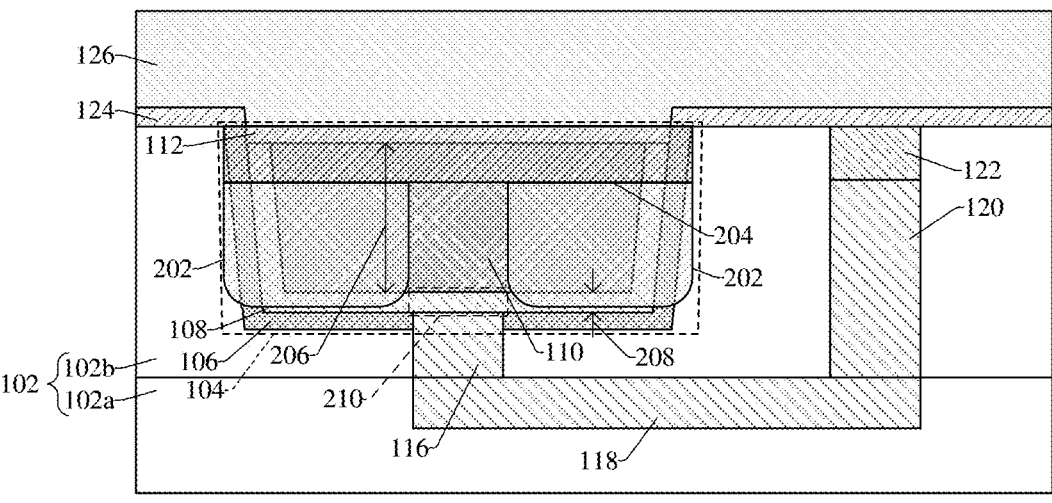
FIG. 2A illustrates a cross-sectional view of some other embodiments of an integrated chip comprising an image sensor having a liner layer disposed along opposing sidewalls and a lower surface of an absorption structure.

FIG. 2A illustrates a cross-sectional view 200a of some other embodiments of an integrated chip comprising an image sensor 104 having a liner layer 108 disposed along opposing sidewalls and a lower surface of an absorption structure 110.

As shown in the cross-sectional view 200a of FIG. 2A, the integrated chip comprises the image sensor 104 disposed within a substrate 102. In some embodiments, the substrate 102 comprises a first semiconductor layer 102a underlying a second semiconductor layer 102b. The first and second semiconductor layers 102a. 102b comprise a first semiconductor material. The first semiconductor material may, for example, be or comprise silicon, epitaxial silicon, or the like. In various embodiments, the first semiconductor layer 102a may have a thickness of about 6 micrometers (μm) or the like and the second semiconductor layer 102b may have at thickness greater than 6 μm, about 12 μm, or the like. In some embodiments, the second semiconductor layer 102b has a low resistance. The low resistance may, for example, be less than about 12 ohms/centimeter (Ω/cm), about 8, 10, or 12 Ω/cm, be between approximately 8 to 12 Ω/cm, or some other suitable value.

The substrate 102 comprises opposing sidewalls and a lower surface that define a recess extending into a top surface of the substrate 102. In various embodiments, the image sensor 104 comprises an absorption structure 110, a liner layer 108, a first doped region 202, and a second doped region 204. For ease of illustration, the first and second doped regions 202, 204 are at least partially transparent in the cross-sectional view 200a. The absorption structure 110 and the liner layer 108 are disposed within the recess of the substrate 102. In various embodiments, the liner layer 108 directly contacts the opposing sidewalls and the lower surface of the substrate 102 that define the recess. Further, the liner layer 108 is disposed directly between the substrate 102 and the absorption structure 110. The absorption structure 110 and the liner layer 108 comprise a second semiconductor material different from the first semiconductor material of the substrate 102. In some embodiments, the second semiconductor material may, for example, be or comprise germanium or some other suitable material.

A capping layer 112 directly overlies top surfaces of the absorption structure 110 and the liner layer 108. In various embodiments, outer sidewalls of the capping layer 112 are aligned with outer sidewalls of the liner layer 108. The capping layer 112 is configured to mitigate damage to the absorption structure 110 and/or the liner layer 108 during fabrication of the integrated chip. The capping layer 112 may comprise the first semiconductor material. The capping layer 112 may, for example, be or comprise silicon, epitaxial silicon, intrinsic silicon, or the like. The capping layer 112 continuously laterally extends from a top surface of the absorption structure 110 to a top surface of the liner layer 108. The capping layer 112 directly contacts the top surfaces of the absorption structure 110 and the liner layer 108. Further, a doped surface region 106 is disposed within the substrate 102 along the opposing sidewalls and the lower surface of the substrate 102 that define the recess. A dielectric layer 124 overlies the substrate 102. The dielectric layer 124 may, for example, be or comprise silicon dioxide or some other suitable dielectric. Further, a dielectric structure 126 overlies the dielectric layer 124 and the substrate 102.

The first doped region 202 extends below the second doped region 204. In some embodiments, the first doped region 202 continuously extends from the absorption structure 110 along at least a portion of the liner layer 108 to the substrate 102. In various embodiments, when viewed from above the first doped region 202 may be ring-shaped (e.g., See FIG. 3B). The first doped region 202 may, for example, be configured as a guard ring, a well region, or the like. The first doped region 202 comprises a first dopant having a first doping type (e.g., p-type). In some embodiments, the first dopant is boron. In other embodiments, the first dopant is gallium, aluminum, or the like. In various embodiments, the second doped region 204 is disposed within the capping layer 112, a portion of the absorption structure 110, a portion of the liner layer 108, and a region of the substrate 102 adjacent to the recess. The second doped region 204 comprises the first dopant (e.g., boron) having the first doping type (e.g., p-type). In various embodiments, the second doped region 204 is configured as a contact region for the image sensor 104 and has a higher doping concentration than the first doped region 202. The doping concentration of the first doped region 202 may, for example, be between approximately 1e17 atoms/cm$^3$ and approximately 1e18 atoms/cm$^3$ or some other suitable value. The doping concentration of the second doped region 204 may, for example, be between approximately 5e17 atoms/cm$^3$ and approximately 1e19 atoms/cm$^3$ or some other suitable value.

The absorption structure 110 comprises the first dopant (e.g., boron) and has the first doping type (e.g., p-type). In various embodiments, a region of the absorption structure 110 adjacent to the first doped region 202 has a doping concentration less than that of the first doped region 202. A vertical well region 116 underlies the absorption structure 110 and continuously extends from a lateral well region 118 through the doped surface region 106 to abut the liner layer 108. In various embodiments, the vertical well region 116 and the lateral well region 118 comprise a second dopant having a second doping type (e.g., n-type) different from the first doping type (e.g., p-type). In various embodiments, the second dopant is phosphorus. In other embodiments, the second dopant is antimony, arsenic, or the like. The liner layer 108 is disposed directly between the absorption structure 110 and the vertical well region 116. In some embodiments, at least a middle region 210 of the liner layer 108 directly between the vertical well region 116 and the absorption structure 110 is intrinsic (e.g., undoped). In such embodiments, the image sensor 104 may be configured as a PIN photodiode. In further embodiments, the liner layer 108 is lightly doped with the first dopant and has the second doping type (e.g., p-type). In such embodiments, the image sensor 104 may be configured as a PN photodiode. The liner layer 108 is configured to mitigate diffusion of the first dopant (e.g., boron) from the absorption structure 110 to the vertical well region 116. This, in part, increases a QE of the image sensor 104 while maintaining a relatively low dark current, thereby increasing an overall performance of the integrated chip.

A connection well region 120 is disposed within the substrate 102 and directly overlies at least a portion of the lateral well region 118. A first contact region 122 is disposed within the substrate 102 and overlies the connection well region 120. In various embodiments, the connection well region 120 and the first contact region 122 comprise the second dopant (e.g., phosphorus) and have the second doping type (e.g., n-type). In some embodiments, a doping concentration of the first contact region 122 is greater than doping concentrations of the vertical well region 116, the lateral well region 118, and the connection well region 120. During operation, the image sensor 104 is configured to absorb incident electromagnetic radiation at the absorption structure 110. After absorption of the incident electromagnetic radiation, a charge carrier (e.g., electron) is generated in the image sensor 104 that migrates to the vertical well region 116 by virtue of an electric field across the image sensor 104. In such embodiments, the vertical well region 116 may be configured as or referred to as a channel region (e.g., an electron channel) and an electrical signal (e.g., a photocurrent) may be measured at the first contact region 122.

In some embodiments, the absorption structure 110 has a thickness 206 that is in a range between approximately 100 nm and 1,500 nm, between approximately 1,500 nm and 3,000 nm, between approximately 100 nm and 3,000 nm, or other suitable values. In various embodiments, the liner layer 108 has a thickness 208 that is in a range between approximately 1 nm and 50 nm, between approximately 50 nm and 100 nm, between approximately 5 nm and 100 nm, or other suitable values. In some embodiments, the thickness 206 of the absorption structure 110 is greater than the thickness 208 of the liner layer 108. In some embodiments, by virtue of the thickness 208 of the liner layer 108 being greater than approximately 1 nm, the liner layer 108 may sufficiently reduce diffusion of dopants from the absorption structure 110 and/or may sufficiently increase a resistance between the absorption structure 110 and the vertical well region 116. In such embodiments, sufficiently increasing the resistance between the absorption structure 110 and the vertical well region 116 decreases dark current in the image sensor 104. In further embodiments, by virtue of the thickness 208 of the liner layer 108 being less than approximately 100 nm, an ability for the image sensor 104 to convert incident electromagnetic radiation into measurable electrical current is increased, thereby increasing the QE of the image sensor 104.

In some embodiments, the liner layer 108 is intrinsic (e.g., undoped). In further embodiments, the liner layer 108 comprises the first doping type (e.g., p-type) with a first doping concentration within a range between approximately 5e15 atoms/cm$^3$ and approximately 1e18 atoms/cm$^3$ or some other suitable value. In some embodiments, the absorption structure 110 comprises the first doping type (e.g., p-type) with a second doping concentration within a range between approximately 5e16 atoms/cm$^3$ and approximately 1e19 atoms/cm$^3$ or some other suitable value. In various embodiments, the first doping concentration of the liner layer 108 is less than the second doping concentration of the absorption structure 110. For example, the second doping concentration of the absorption structure 110 is at least ten times greater than the first doping concentration of the liner layer 108. In some embodiments, by virtue of the absorption structure 110 having a doping concentration at least ten times greater than that of the liner layer 108, a QE of the image sensor 104 may be sufficiently increased while mitigating diffusion of dopants from the absorption structure 110 and/or the liner layer 108 to the vertical well region 116. Further, in such embodiments, the liner layer 108 comprising the first doping type facilitates the liner layer 108 passivating defects at a silicon-germanium interface between the liner layer 108 and the substrate 102. In yet further embodiments, the first doping concentration of the liner layer 108 is less than or equal to a doping concentration of the vertical well region 116. In such embodiments, this facilitates the image sensor 104 generating an appropriate electric field such that charge carriers generated from absorbed incident electromagnetic radiation may efficiently migrate to the vertical well region 116.

In some embodiments, the doping concentration of the first doped region 202 is greater than a doping concentration of regions of the absorption structure 110 adjacent to or abutting the first doped region 202 (e.g., in a middle region of the absorption structure 110 above the middle region 210 of the liner layer 108). Further, in such embodiments, the doping concentration of the second doped region 204 is greater than the doping concentration of the first doped region 202.

In yet further embodiments, the liner layer 108 may comprise a first p-type dopant (e.g., gallium) and the absorption structure 110 may comprise a second p-type dopant (e.g., boron) different from the first p-type dopant. In such embodiments, the first p-type dopant has a lower likelihood to diffuse out than the second p-type dopant (e.g., because an atomic size of the first p-type dopant is greater than an atomic size of the second p-type dopant). As a result, the liner layer 108 may passivate defects at the interface between the liner layer 108 while further mitigating diffusion of the first and/or second p-type dopants to the vertical well region 116. In some embodiments, the first p-type dopant is gallium and the second p-type dopant is boron. In various embodiments, the liner layer 108 may be referred to as a barrier layer, a diffusion barrier layer, or the like.

Figure 2B:
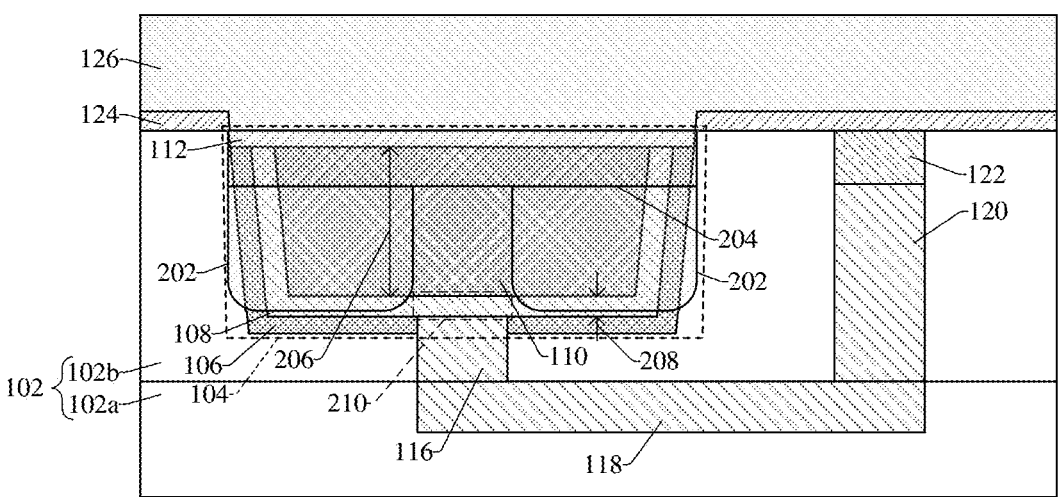
FIGS. 2B and 2C illustrate cross-sectional views of some alternative embodiments of the integrated chip of FIG. 2A.

FIG. 2B illustrates a cross-sectional view 200b corresponding to some alternative embodiments of the integrated chip of FIG. 2A, in which the capping layer 112 continuously extends from top surfaces of the absorption structure 110 and the liner layer 108 to a top surface of the doped surface region 106. In such embodiments, outer sidewalls of the capping layer 112 are aligned with outer sidewalls of the doped surface region 106. In some embodiments, the doped surface region 106 may be configured as a doped epitaxial layer comprising epitaxial silicon having the first doping type (e.g., p-type). In such embodiments, the doped surface region 106 may be formed by an epitaxial process (e.g., molecular-beam epitaxy (MBE), vapor-phase epitaxy (VPE), liquid-phase epitaxy (LPE), etc.) while in-situ doping the doped surface region 106 with the first doping type (e.g., p-type). In some embodiments, a thickness of the doped surface region 106 is less than a thickness of the liner layer 108.

Figure 2C:
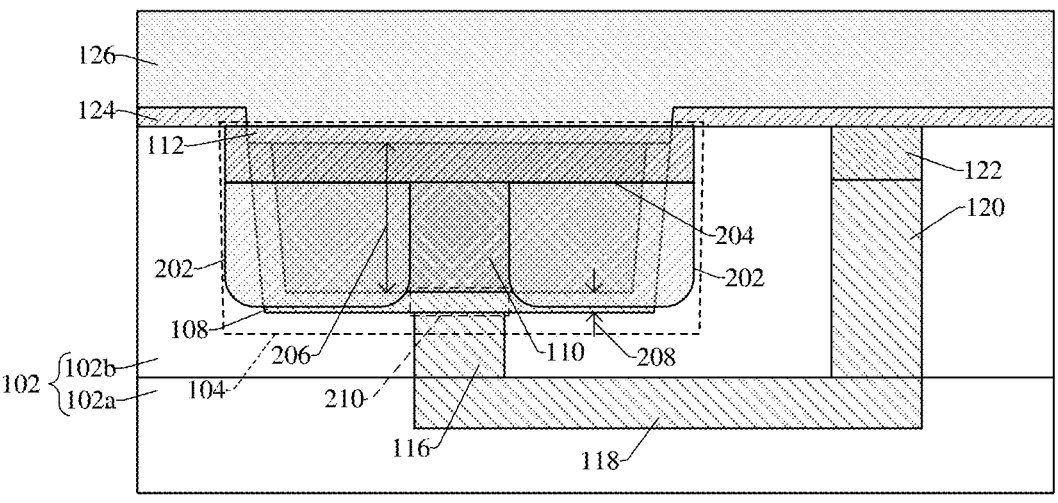

FIG. 2C illustrates a cross-sectional view 200c corresponding to some alternative embodiments of the integrated chip of FIG. 2A, in which the doped surface region (106 of FIG. 2A) is omitted. In some embodiments, the liner layer 108 is undoped (e.g., at least a middle region 210 of the liner layer 108 between the absorption structure 110 and the vertical well region 116 comprises intrinsic germanium). In further embodiments, the liner layer 108 is lightly doped and comprises the first doping type (e.g., p-type) having a doping concentration less than that of the absorption structure 110.

Figure 3A:
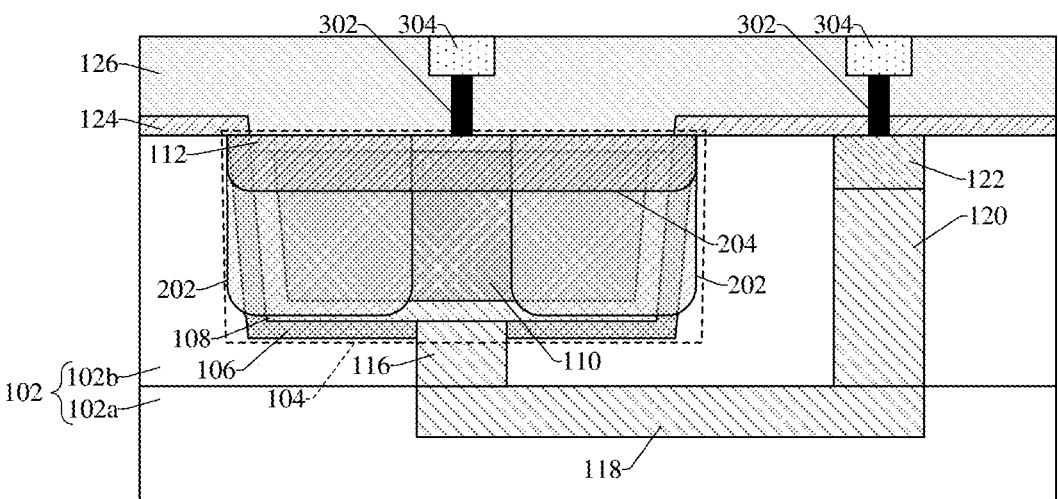
FIG. 3A illustrates a cross-sectional view of some other embodiments of the integrated chip of FIG. 2A.

FIG. 3A illustrates a cross-sectional view 300a corresponding to some other embodiments of the integrated chip of FIG. 2A, in which a plurality of conductive contacts 302 and a plurality of conductive wires 304 are disposed over the substrate 102 and within the dielectric structure 126. The conductive contacts 302 and the conductive wires 304 are configured to facilitate electrical coupling to the image sensor 104.

Figure 3B:
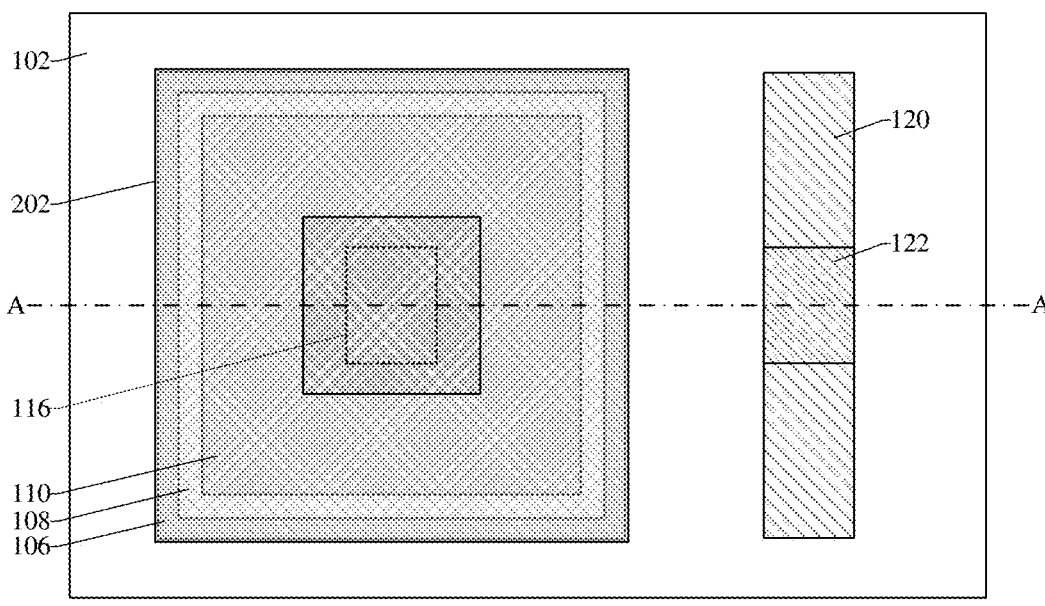
FIG. 3B illustrates a top layout view of some embodiments of the integrated chip of FIG. 3A.

FIG. 3B illustrates a top layout view 300b of some embodiments of the integrated chip of FIG. 3A. The cross-sectional view 300a of FIG. 3A may, for example, be taken along line A in FIG. 3B. Further, for ease of illustration the second doped region 204 is omitted from the top layout view 300b of FIG. 3B and the first doped region 202 is partially transparent.

As illustrated in FIG. 3B, the liner layer 108 continuously extends around an outer perimeter of the absorption structure 110 in a closed path. Further, the doped surface region 106 continuously laterally extends around the liner layer 108. In some embodiments, the first doped region 202 is ring shaped and laterally extends around a center region of the absorption structure 110. The connection well region 120 and the first contact region 122 are each adjacent to a first side of the absorption structure 110. In addition, the vertical well region 116 (illustrated as a dashed box) directly underlies the center region of the absorption structure 110.

Figure 4A:
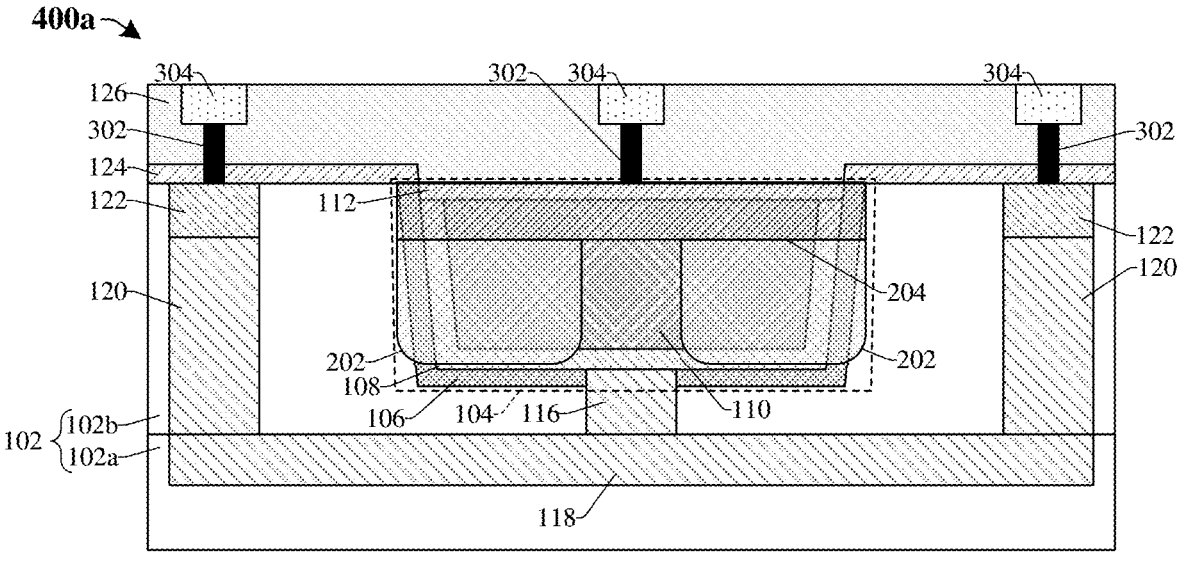
FIGS. 4A and 4B illustrate various views of some other embodiments of an integrated chip comprising an image sensor having a liner layer disposed along opposing sidewalls and a lower surface of an absorption structure.
Figure 4B:
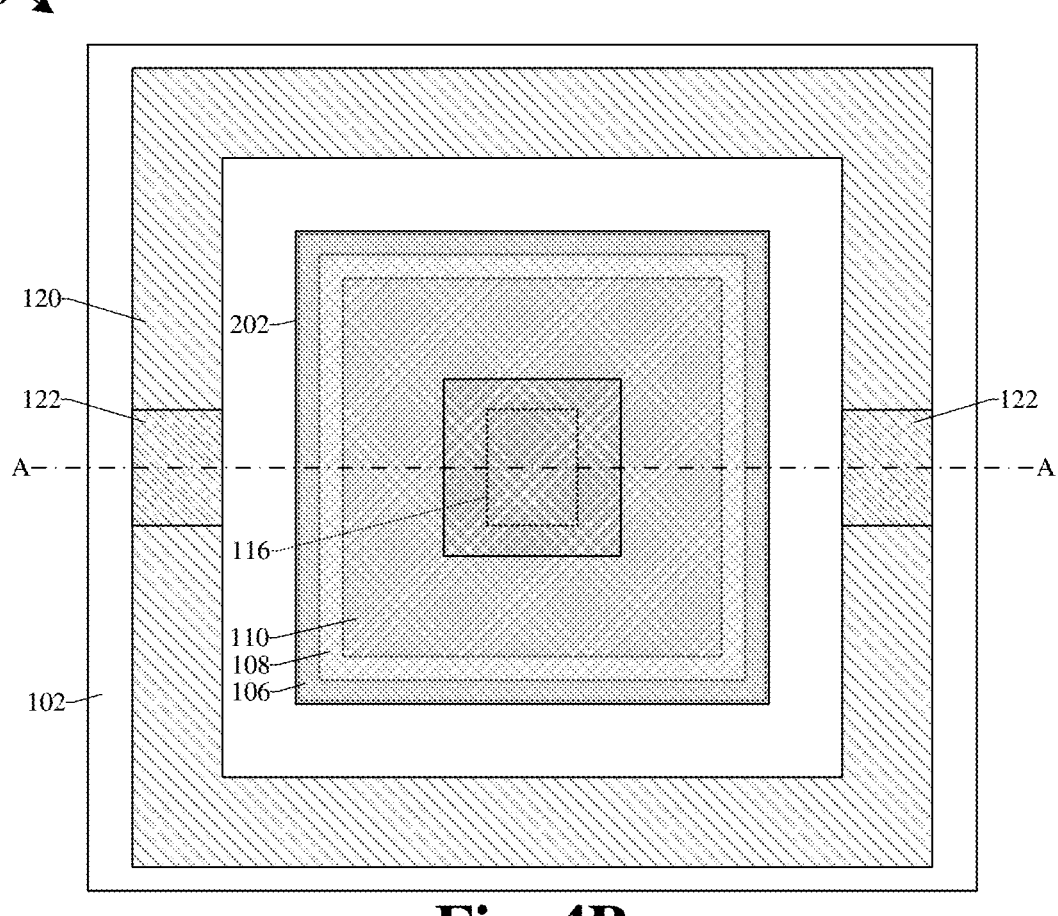

FIGS. 4A and 4B illustrate a cross-sectional view 400a and a top layout view 400b corresponding to other embodiments of the integrated chip of FIGS. 3A and 3B, in which the connection well region 120 and the first contact region 122 are disposed on opposing sides of the absorption structure 110. The cross-sectional view 400a of FIG. 4A may, for example, be taken along line A in FIG. 4B.

As illustrated in FIG. 4A, the lateral well region 118 continuously laterally extends from a first segment of the connection well region 120 to a second segment of the connection well region 120, where the first and second segments of the connection well region 120 are disposed on opposing sides of the absorption structure 110.

As illustrated in FIG. 4B, the connection well region 120 continuously extends around the outer perimeter of the absorption structure 110 in a closed path. Thus, in some embodiments, the connection well region 120 is ring-shaped. Further, the first contact region 122 has at least two discrete segments disposed on opposing sides of the absorption structure 110 that overlap the connection well region 120.

Figure 5:
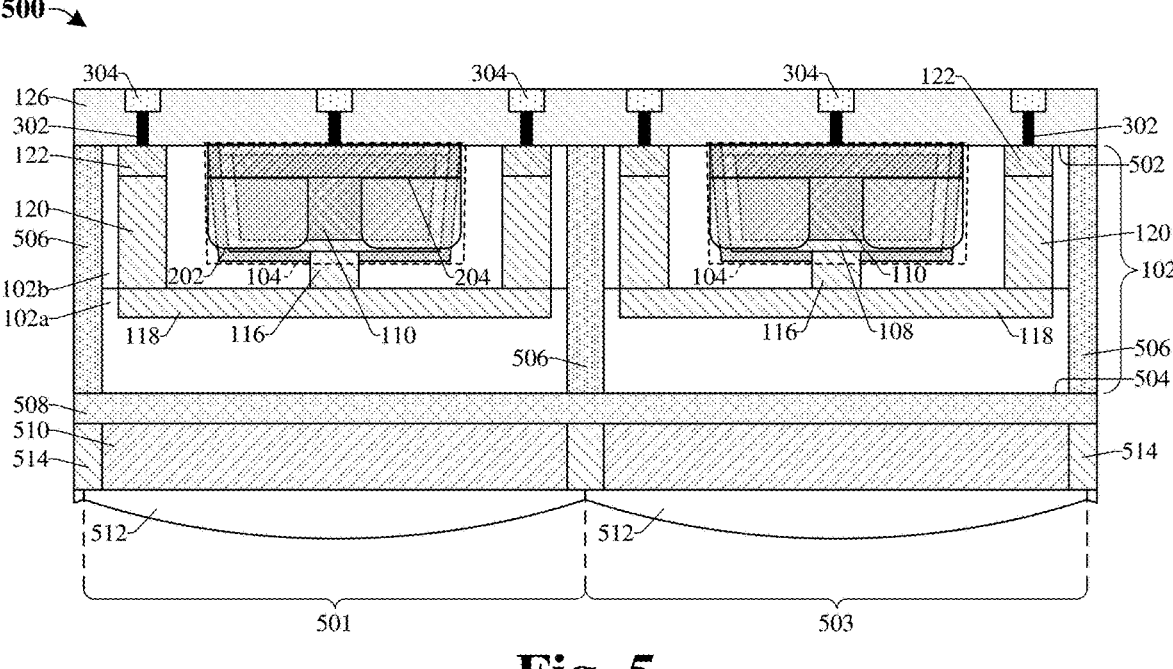
FIG. 5 illustrates a block diagram of some embodiments of an integrated chip comprising a depth sensor having a liner layer disposed along opposing sidewalls and a lower surface of an absorption structure.

FIG. 5 illustrates a cross-sectional view 500 corresponding to some embodiments of an integrated chip comprising a plurality of pixel regions 501, 503 disposed within a substrate 102. The plurality of pixel regions 501, 503 respectively comprise an image sensor 104 that may, for example, be configured as illustrated and/or described in FIGS. 4A and 4B. In other embodiments, each image sensor 104 may be configured as illustrated and/or described in FIGS. 1, 2A, 2B, 2C, 3A, and 3B.

The integrated chip includes the substrate 102 having a first surface 502 opposite a second surface 504. An isolation structure 506 is disposed within the substrate 102 and is disposed between adjacent pixel regions in the plurality of pixel regions 501, 503. In some embodiments, the isolation structure 506 comprises a dielectric material (e.g., silicon dioxide, silicon nitride, or the like), a metal material (e.g., aluminum, tungsten, copper, or the like), some other suitable material, or any combination of the foregoing. The isolation structure 506 is configured to increase optical and/or electrical isolation between the adjacent pixel regions. A lower dielectric layer 508 is disposed along the second surface 504 of the substrate 102. The lower dielectric layer 508 may be configured as an anti-reflective coating (ARC) configured to decrease reflection of electromagnetic radiation away from the substrate 102. The lower dielectric layer 508 may, for example, be or comprise silicon dioxide, silicon oxynitride, silicon oxycarbide, or the like.

A grid structure 514 is disposed on the lower dielectric layer 508. The grid structure 514 may, for example, comprise a metal material, a dielectric material, or a combination of the foregoing. The grid structure 514 is configured to direct electromagnetic radiation towards the pixel regions 501, 503. A plurality of light filters 510 (e.g., color filters, IR filters, or the like) are disposed on the lower dielectric layer 508 between opposing sidewalls of the grid structure 514. The light filters 510 are configured to transmit specific wavelengths of incident radiation. In addition, a plurality of micro-lenses 512 are disposed on the plurality of light filters 510. The micro-lenses 512 are configured to focus electromagnetic radiation towards the pixel regions 501, 503.

Figure 6:
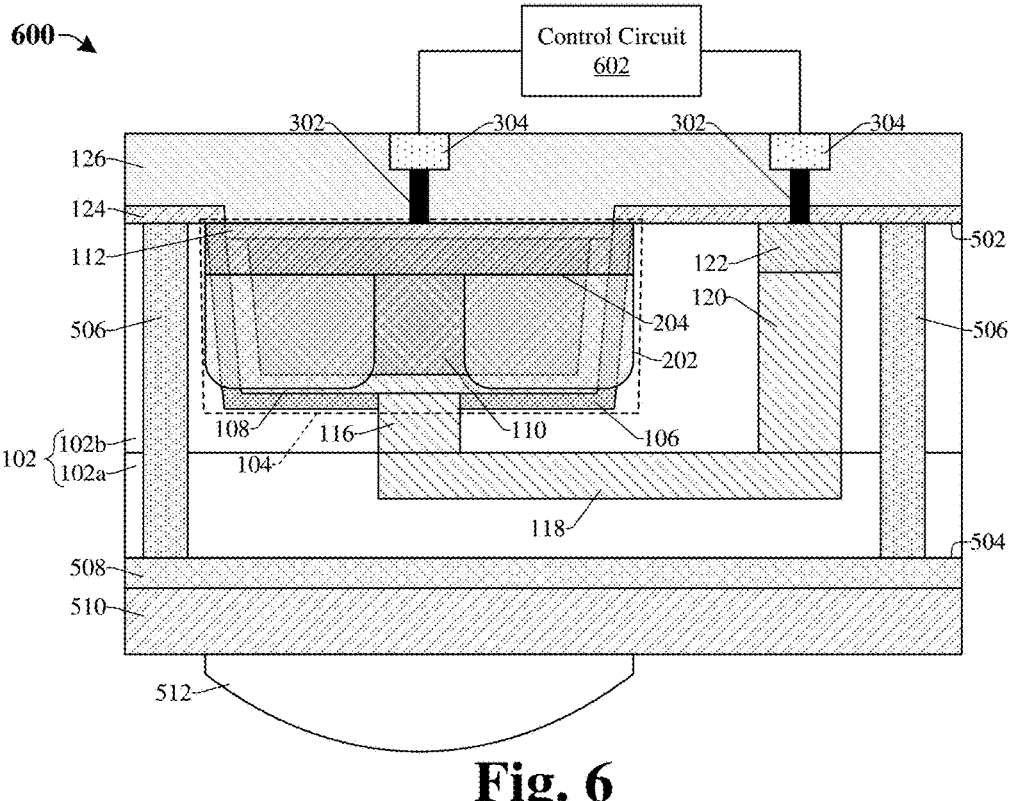
FIG. 6 illustrates a cross-sectional view of some additional embodiments of an integrated chip comprising image sensors having a liner layer disposed along opposing sidewalls and a lower surface of an absorption structure.

FIG. 6 illustrates a block diagram 600 of some other embodiments of an integrated chip comprising an image sensor 104 having a liner layer 108 disposed along opposing sidewalls and a lower surface of an absorption structure 110. The image sensor 104 is configured as a depth sensor for a time-of-flight (TOF) system. In various embodiments, the image sensor 104 may be configured as illustrated and/or described in FIG. 2A. In other embodiments, the image sensor 104 may be configured as illustrated and/or described in FIGS. 1, 2B, 2C, 3A, 3B, 4A, and 4B.

The integrated chip comprises an image sensor 104 disposed within the substrate 102, where the image sensor 104 is configured as a depth sensor. The image sensor 104 comprises the liner layer 108 and the absorption structure 110. A first doped region 202 and a second doped region 204 are disposed at least in part in the absorption structure 110. The first and second doped regions 202, 204 comprise a first doping type (e.g., p-type). A vertical well region 116 extends from the liner layer 108 to a lateral well region 118. A connection well region 120 overlies the lateral well region 118 in a region offset from the absorption structure 110. A first contact region 122 is disposed above the connection well region 120. The vertical well region 116, the lateral well region 118, the connection well region 120, and the first contact region 122 respectively comprise a second doping type (e.g., n-type) opposite the first doping type.

The second doped region 204 and the first contact region 122 are electrically coupled to a control circuit 602 by way, for example, of the conductive contacts 302 and the conductive wires 304. During operation, incident electromagnetic radiation that strikes the absorption structure 110 causes charge carriers to form within the absorption structure 110. The control circuit 602 is configured to selectively apply bias voltages to the second doped region 204 and/or the first contact region 122. For example, the second doped region 204 may be biased with a first voltage (e.g., about 0 volts) and the first contact region 122 may be biased with a second voltage (e.g., about 1 volt). When appropriate bias voltages are applied to the second doped region 204 and/or the first contact region 122, an electric field generated by charges within the absorption structure 110 (e.g., within the first and/or second doped regions 202, 204) may cause charge carriers to move from the absorption structure 110 to the vertical well region 116.

FIGS. 7-16 illustrate cross-sectional views 700-1600 of some embodiments of a method of forming an integrated chip having a liner layer disposed along opposing sidewalls and a bottom surface of an absorption structure. Although the cross-sectional views 700-1600 shown in FIGS. 7-16 are described with reference to a method, it will be appreciated that the structures shown in FIGS. 7-16 are not limited to the method but rather may stand alone separate of the method. Furthermore, although FIGS. 7-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
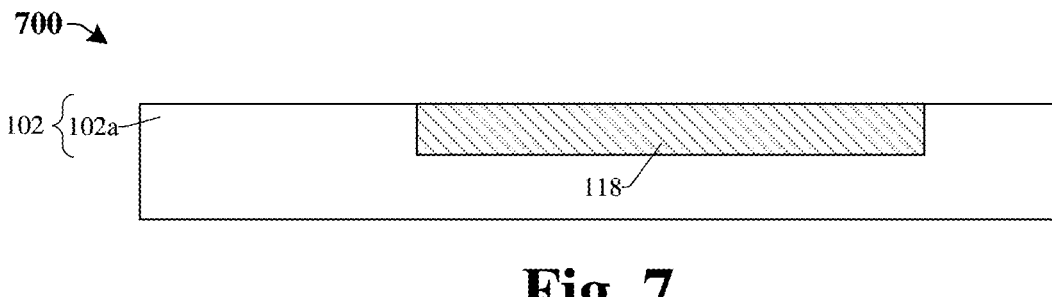
FIGS. 7-16 illustrate cross-sectional views of some embodiments of a method of forming an integrated chip comprising an image sensor having a liner layer disposed along opposing sidewalls and a lower surface of an absorption structure.

As shown in cross-sectional view 700 of FIG. 7, a lateral well region 118 is formed within a first semiconductor layer 102*a* of a substrate 102. In various embodiments, the first semiconductor layer 102*a* may, for example, be or comprise silicon, epitaxial silicon, bulk silicon, a silicon-on-insulator (SOI) substrate, one or more epitaxial layers, or the like. Further, the first semiconductor layer 102*a* may, for example, have a thickness of about 6 μm or some other suitable value. In yet further embodiments, the first semi-conductor layer 102*a* may have a first doping type (e.g., p-type). The lateral well region 118 comprises a second doping type (e.g., n-type) opposite the first doping type (e.g., p-type). In various embodiments, a process for forming the lateral well region 118 includes forming an implant mask (not shown) over the first semiconductor layer 102*a* and implanting dopants (e.g., phosphorus, antimony, arsenic, or the like) into the first semiconductor layer 102*a* according to the implant mask.

Figure 8:
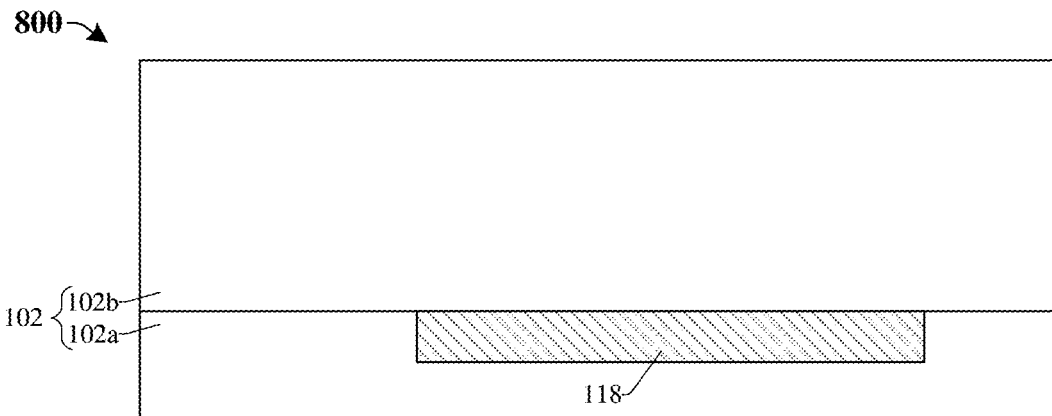

As shown in cross-sectional view 800 of FIG. 8, a second semiconductor layer 102*b* is formed over the first semicon-ductor layer 102*a*, where the second semiconductor layer 102*b* is part of the substrate 102. The second semiconductor layer 102*b* may, for example, be formed on the first semi-conductor layer 102*a* by molecular-beam epitaxy (MBE), vapor-phase epitaxy (VPE), liquid-phase epitaxy (LPE), some other suitable epitaxial process, or another suitable growth or deposition process. In various embodiments, the second semiconductor layer 102*b* has a thickness greater than 6 μm, about 12 μm, or some other suitable value. In further embodiments, the second semiconductor layer 102*b* has a low resistance of about 8, 10, or 12 Ω/cm, between approximately 8 to 12 Ω/cm, less than about 12 Ω/cm, or some other suitable value. The first and second semicon-ductor layers 102*a*, 102*b* respectively comprise a first semi-conductor material. In some embodiments, the first semi-conductor material is silicon, epitaxial silicon, crystalline silicon, or the like.

Figure 9:
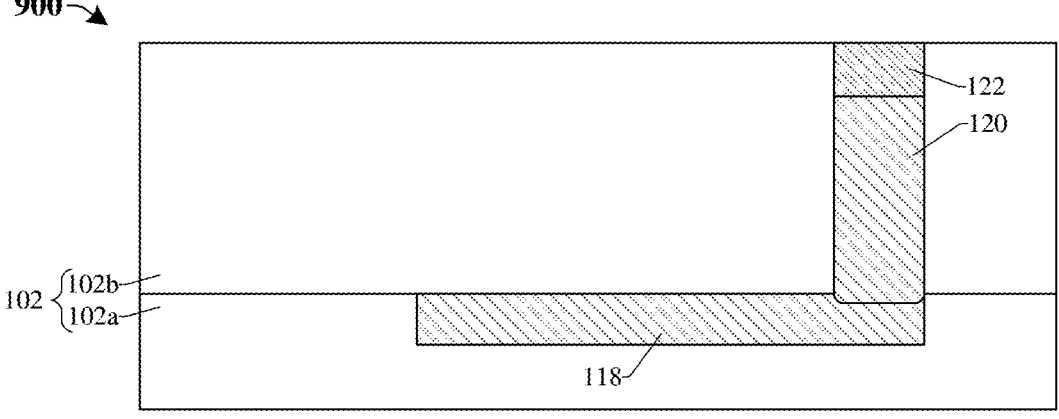

As shown in cross-sectional view 900 of FIG. 9, a connection well region 120 and a first contact region 122 are formed in the second semiconductor layer 102*b* over the lateral well region 118. In various embodiments, the first contact region 122 and the connection well region 120 comprise the second doping type (e.g., n-type). The con-nection well region 120 and the first contact region 122 may be formed by one or more implantation processes. In some embodiments, the connection well region 120 may be formed by a first implantation process that includes forming a first implant mask (not shown) over the substrate 102 and implanting dopants (e.g., phosphorus, antimony, arsenic, or the like) into the substrate 102 according to the first implant mask. In further embodiments, the first contact region 122 may be formed by a second implantation process that includes implanting dopants (e.g., phosphorus, antimony, arsenic, or the like) into the substrate 102. In various embodiments, the second implantation process is performed according to the first implant mask utilized in the first implantation process. In yet further embodiments, the first contact region 122 and the connection well region 120 are formed by a single implantation process. In some embodi-ments, the first contact region 122 has a higher doping concentration than the connection well region 120 and/or the lateral well region 118.

Figure 10:
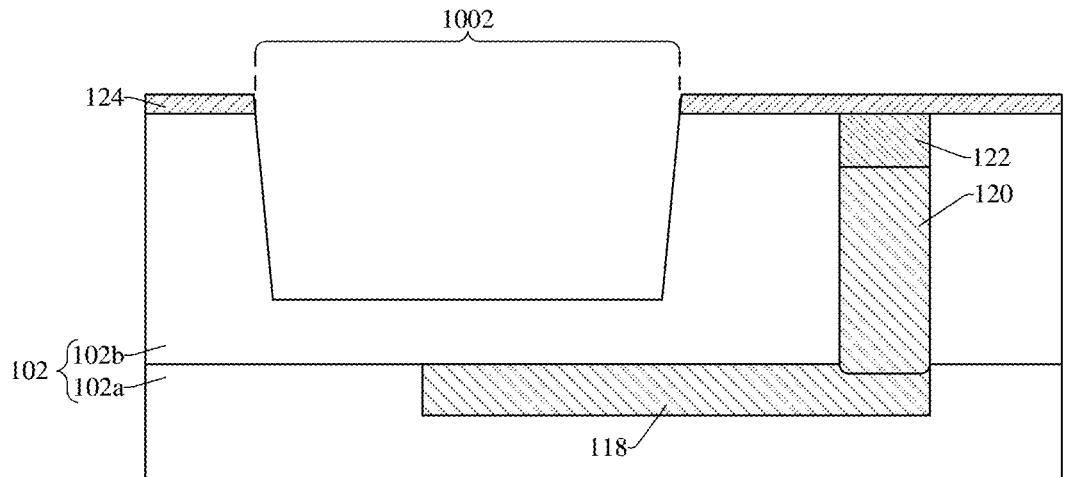

As shown in cross-sectional view 1000 of FIG. 10, a dielectric layer 124 is formed over the substrate 102 and a patterning process is performed on the substrate 102 and the dielectric layer 124 to form a recess 1002 extending into a top surface of the substrate 102. The dielectric layer 124 may, for example, be or comprise silicon dioxide, some other suitable dielectric, or the like. The recess 1002 may be defined by one or more surfaces of the substrate 102, such as opposing sidewalls and an upper surface of the second semiconductor layer 102*b*. In some embodiments, a depth of the recess 1002 is within a range of approximately 100 to 3,050 nm, within a range of approximately 100 to 1,500 nm, within a range of approximately 1,500 to 3,050 nm, or some other suitable value. In some embodiments, the patterning process includes: forming a masking layer (not shown) over the substrate 102 and exposing the substrate 102 and/or the dielectric layer 124 to one or more etchants, thereby forming the recess 1002. In various embodiments, the masking layer may be removed during and/or after the patterning process. Further, the patterning process may, for example, include a dry etch process (e.g., a reactive ion etch, a plasma etch, etc.), a wet etch process, another suitable etch process, or any combination of the foregoing. The dielectric layer 124 may be formed over the substrate 102 by, for example, chemical vapor deposition (CVD), physical vapor deposi-tion (PVD), atomic layer deposition (ALD), or another suitable deposition or growth process.

Figure 11:
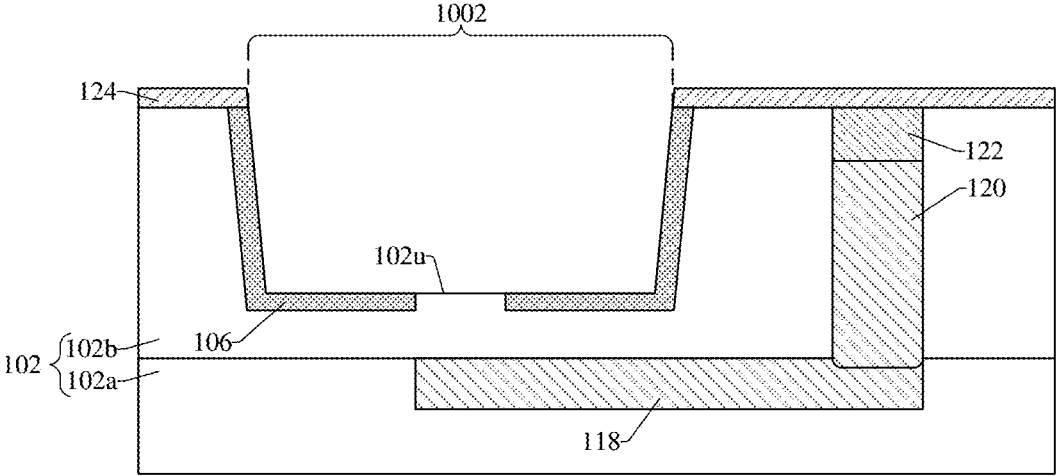

As shown in cross-sectional view 1100 of FIG. 11, a doped surface region 106 is formed along the one or more surfaces of the substrate 102 that define the recess 1002. In some embodiments, the doped surface region 106 comprises the first doping type (e.g., p-type). In various embodiments, a process for forming the doped surface region 106 com-prises forming an implant mask (now shown) over the substrate 102 and implanting dopants (e.g., boron, gallium, aluminum, or the like) into the second semiconductor layer 102*b* along the one or more surfaces of the substrate 102 that define the recess 1002. In various embodiments, the doped surface region 106 is discontinuous along a middle region of an upper surface 102*u* of the substrate 102. In further embodiments, the doped surface region 106 continuously extends along the upper surface 102*u* of the substrate 102 (not shown).

Figure 12:
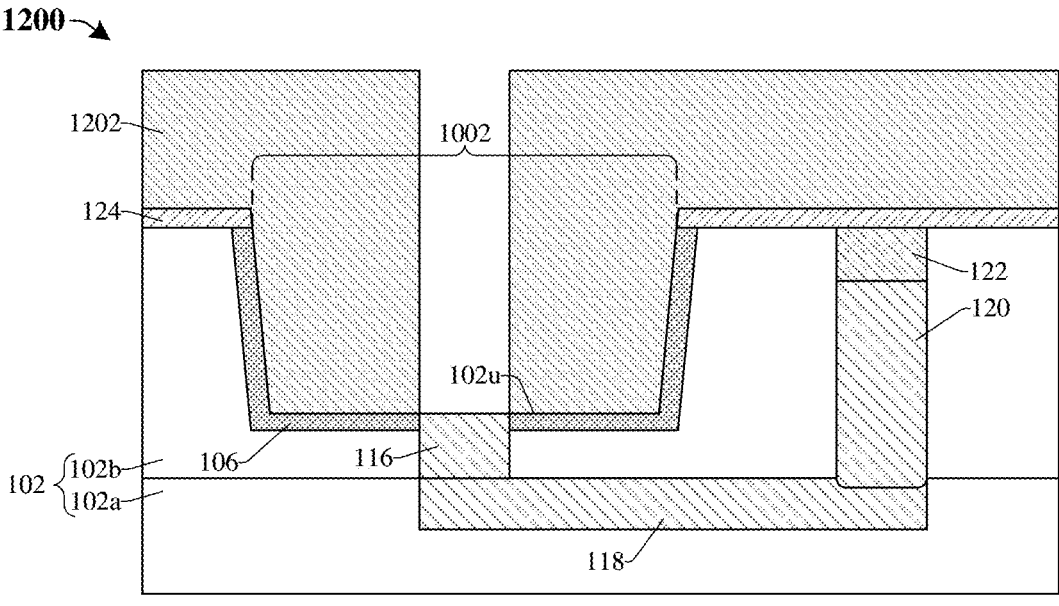

As shown in cross-sectional view 1200 of FIG. 12, a vertical well region 116 is formed within the substrate 102 over the lateral well region 118. In various embodiments, the vertical well region 116 comprises the second doping type (e.g., n-type). In some embodiments, the vertical well region 116 is formed by an implantation process that includes forming an implant mask 1202 over the substrate 102 and implanting dopants (e.g., phosphorus, antimony, arsenic, or the like) into the substrate 102 according to the implant mask 1202. In various embodiments, after forming the vertical well region 116, a removal process is performed to remove the implant mask 1202 (not shown). In various embodi-ments, the vertical well region 116 continuously vertically extends from the upper surface 102*u* of the substrate 102 to the lateral well region 118 and abuts sides of the doped surface region 106.

Figure 13:
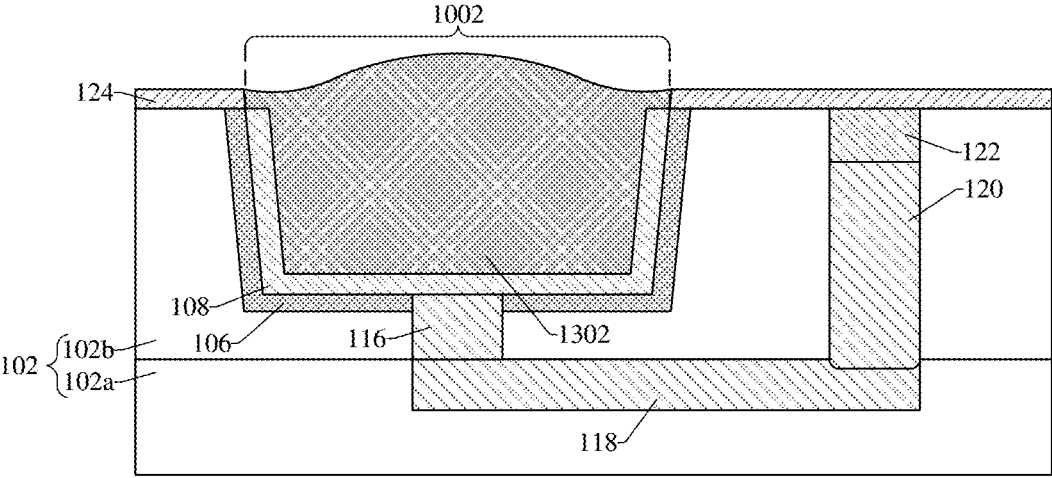

As shown in cross-sectional view 1300 of FIG. 13, a liner layer 108 and an absorption layer 1302 are formed within the recess 1002. The liner layer 108 is formed along the one or more surfaces of the substrate 102 defining the recess and directly contacts the substrate 102. The absorption layer 1302 is formed on the liner layer 108. The liner layer 108 and the absorption layer 1302 respectively comprise a second semiconductor material (e.g., germanium) different from the first semiconductor material (e.g., silicon).

In some embodiments, the liner layer 108 is formed by a first deposition process (e.g., a CVD process, PVD process, epitaxial growth process such as MBE, VPE, LPE, or the like) such that the liner layer 108 is undoped or comprises an intrinsic form of the second semiconductor material (e.g., intrinsic germanium). In various embodiments, the first deposition process includes flowing a precursor gas (e.g., germane (GeH₄)) over the substrate 102 in a chamber at a low temperature (e.g., less than about 400° Celsius, within a range of about 350° Celsius to 450° Celsius, etc.). In further embodiments, the liner layer 108 is formed by a second deposition process (e.g., a CVD process, PVD process, epitaxial growth process such as MBE, VPE, LPE, or the like) that in-situ dopes the liner layer 108 with one or more dopants (e.g., boron) having the first doping type (e.g., p-type). In such embodiments, the second deposition process includes flowing a precursor gas (e.g., germane) and another gas (e.g., diborane) over the substrate 102 in a chamber at the low temperature. In various embodiments, the liner layer 108 is selectively grown along surfaces of the substrate 102 that are left exposed by the dielectric layer 124. In some embodiments, the low temperature is less than about 400° Celsius, within a range of about 350° Celsius to 450° Celsius, or some other suitable value.

In yet further embodiments, the absorption layer 1302 is formed by a third deposition process (e.g., a CVD process, a PVD process, MBE, VPE, LPE, or the like) such that the absorption layer 1302 comprises one or more dopants (e.g., boron) having the first doping type (e.g., p-type). In some embodiments, the third deposition process includes in-situ doping the absorption layer 1302 (e.g., with a processing gas such as diborane) while depositing the absorption layer 1302 or includes performing an ion implantation process after depositing the absorption layer 1302 to dope the absorption layer 1302 with the one or more dopants (e.g., boron). In various embodiments, the third deposition process includes flowing a precursor gas (e.g., germane) and another gas (e.g., diborane) over the substrate 102 in a chamber at a high temperature (e.g., greater than about 400° Celsius, within a range of about 400° Celsius to 700° Celsius, etc.). Accordingly, in some embodiments, the liner layer 108 is formed at a first temperature (e.g., less than about 450° Celsius) and the absorption layer 1302 is formed at a second temperature (e.g., greater than about 450° Celsius) less than the first temperature. Forming the absorption layer 1302 at the higher temperature may, for example, facilitate the absorption layer 1302 having a higher doping concentration than the liner layer 108 and/or facilitates the absorption layer 1302 having a relatively uniform doping concentration across an entire thickness of the absorption layer 1302. The liner layer 108 separates the absorption layer 1302 from the vertical well region 116 and is configured to mitigate diffusion of dopants (e.g., boron) from the absorption layer 1302 to the vertical well region 116. As a result, a performance (e.g., QE) of the image sensor (104 of FIG. 15) is increased.

In various embodiments, when the liner layer 108 is formed by the second deposition process and comprises the one or more dopants (e.g., boron), the liner layer 108 has a first doping concentration between approximately 5e15 atoms/cm³ and approximately 1e18 atoms/cm³ or some other suitable value. In some embodiments, the absorption layer 1302 has a second doping concentration of the first doping type (e.g., p-type) that is between approximately 5e16 atoms/cm³ and approximately 1e19 atoms/cm³ or some other suitable value. Accordingly, the second doping concentration of the absorption layer 1302 is greater than the first doping concentration of the liner layer 108.

Figure 14:
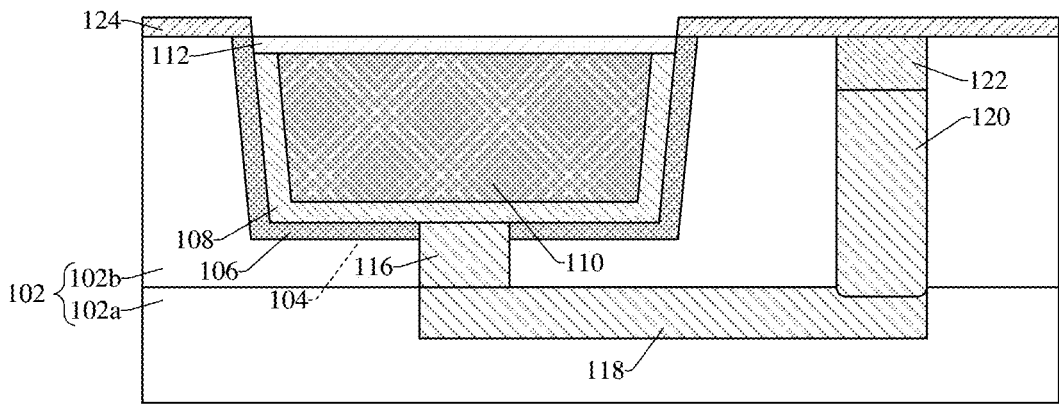

As shown in cross-sectional view 1400 of FIG. 14, a portion of the absorption layer (1302 of FIG. 13) is removed thereby forming an absorption structure 110 and a capping layer 112 is formed along the absorption structure 110 and the liner layer 108. In various embodiments, the portion of the absorption layer (1302 of FIG. 13) is removed by an etching process (e.g., a dry etch process) that may remove a portion of the liner layer 108. In further embodiments, the portion of the absorption layer (1302 of FIG. 13) is removed by a planarization process (e.g., a chemical mechanical planarization (CMP) process) that may remove a portion of the liner layer 108. In some embodiments, top surfaces of the liner layer 108 and the absorption structure 110 are co-planar and are recessed below the top surface of the substrate 102. In further embodiments, top surfaces of the liner layer 108 and the absorption structure 110 are co-planar with the top surface of the substrate 102 (not shown). Further, the capping layer 112 is formed along the top surfaces of the liner layer 108 and the absorption structure 110 by, for example, a CVD process, a PVD process, an ALD process, an epitaxial growth process (e.g., MBE, VPE, LPE, etc.), or the like. The capping layer 112 may, for example, be or comprise silicon, epitaxial silicon, intrinsic silicon (e.g., undoped silicon), some other suitable material, or the like. In some embodiments, a top surface of the capping layer 112 is co-planar with the top surface of the substrate 102. In further embodiments, the top surface of the capping layer 112 is recessed below the top surface of the substrate 102 (not shown).

Figure 15:
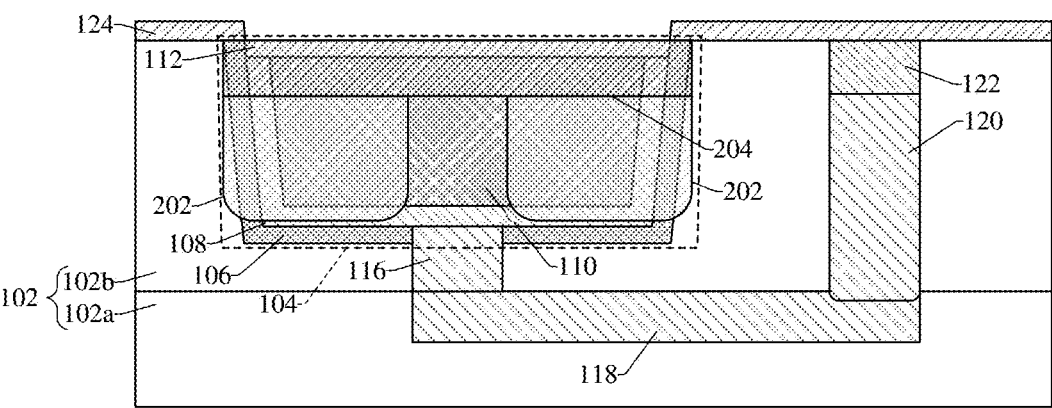

As shown in cross-sectional view 1500 of FIG. 15, a first doped region 202 and a second doped region 204 are formed within the absorption structure 110, thereby forming an image sensor 104. The first doped region 202 and the second doped region 204 comprise the first doping type (e.g., p-type). In some embodiments, a doping concentration of the first doped region 202 is less than a doping concentration of the second doped region 204. The doping concentration of the first doped region 202 may, for example, be between approximately 1e17 atoms/cm³ and approximately 1e18 atoms/cm³. The doping concentration of the second doped region 204 may, for example, be between approximately 5e17 atoms/cm³ and approximately 1e19 atoms/cm³. In some embodiments, the first doped region 202 is formed by a first implantation process that includes forming a first implant mask (not shown) over the substrate 102 and implanting dopants (e.g., boron, gallium, aluminum, or the like) into the substrate 102, the liner layer 108, and/or the absorption structure 110 according to the first implant mask. In various embodiments, the second doped region 204 is formed by a second implantation process that includes forming a second implant mask (not shown) over the substrate 102 and implanting dopants (e.g., boron, gallium, aluminum, or the like) into the substrate 102, the capping layer 112 the liner layer 108, and/or the absorption structure 110 according to the second implant mask.

Figure 16:
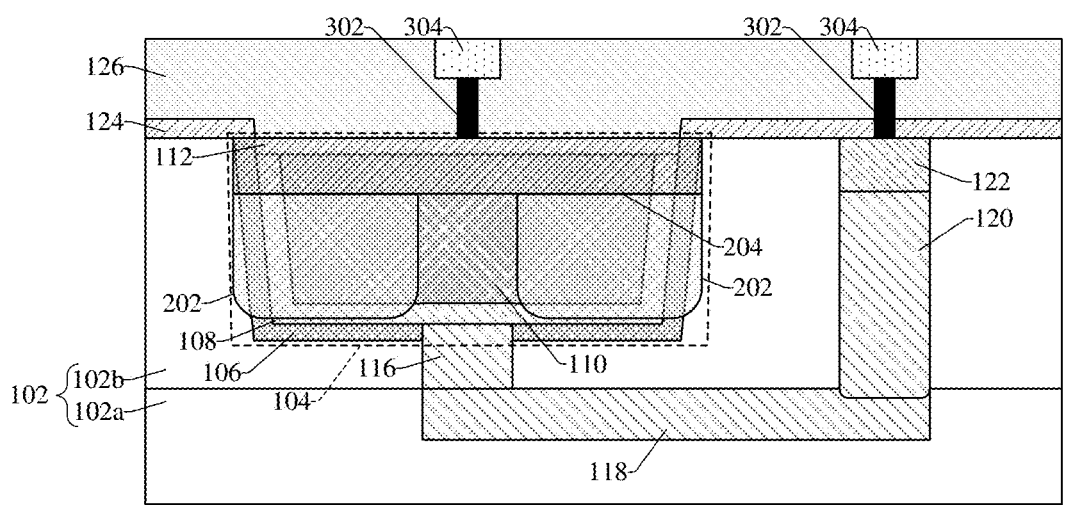

As shown in cross-sectional view 1600 of FIG. 16, a dielectric structure 126, a plurality of conductive contacts 302, and a plurality of conductive wires 304 are formed over the substrate 102. The dielectric structure 126 may be formed by one or more deposition processes (e.g., one or more CVD processes, one or more PVD processes, one or more ALD processes, etc.). The conductive contacts 302 are formed within the dielectric structure 126 and overlie the second doped region 204 and the first contact region 122. The plurality of conductive wires 304 are formed over the conductive contacts 302.

FIG. 17 illustrates a flow diagram of some embodiments of a method 1700 of forming an integrated chip having a liner layer disposed along opposing sidewalls and a bottom surface of an absorption structure. Although the method 1700 is illustrated and/or described as a series of acts or events, it will be appreciated that the method 1700 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a lateral well region is formed within a substrate. FIG. 7 illustrates a cross-sectional view 700 corresponding to some embodiments of act 1702.

At act 1704, a connection well region and a first contact region are formed over a first side of the lateral well region. FIG. 9 illustrates a cross-sectional view 900 corresponding to some embodiments of act 1704.

At act 1706, the substrate is patterned to form a recess in the substrate over the lateral well region and laterally offset from the connection well region, where the recess is defined by opposing sidewalls and an upper surface of the substrate. FIG. 10 illustrates a cross-sectional view 1000 corresponding to some embodiments of act 1706.

At act 1708, a doped surface region is formed along the opposing sidewalls and upper surface of the substrate. FIG. 11 illustrates a cross-sectional view 1100 corresponding to some embodiments of act 1708.

At act 1710, a vertical well region is formed in the substrate extending from the upper surface of the substrate to the lateral well region. FIG. 12 illustrates a cross-sectional view 1200 corresponding to some embodiments of act 1710.

At act 1712, a liner layer is formed along the opposing sidewalls and upper surface of the substrate. FIG. 13 illustrates a cross-sectional view 1300 corresponding to some embodiments of act 1712.

At act 1714, an absorption structure is formed on the liner layer and within the recess. FIGS. 13 and 14 illustrate cross-sectional views 1300 and 1400 corresponding to some embodiments of act 1714.

At act 1716, a capping layer is formed along the absorption structure and the liner layer. FIG. 14 illustrates the cross-sectional view 1400 corresponding to some embodiments of act 1716.

At act 1718, a first doped region and a second doped region are formed within the absorption structure. FIG. 15 illustrates a cross-sectional view 1500 corresponding to some embodiments of act 1718.

At act 1720, a plurality of conductive contacts are formed over the second doped region and the first contact region. FIG. 16 illustrates a cross-sectional view 1600 corresponding to some embodiments of act 1720.

Accordingly, in some embodiments, the present disclosure relates to an integrated chip having a liner layer disposed along opposing sidewalls and a bottom surface of an absorption structure, where the liner layer is spaced between the absorption structure and an underlying vertical well region.

In some embodiments, the present application provides an integrated chip including: a substrate comprising a first semiconductor material and a recess in a top surface of the substrate; an absorption structure disposed within the recess and comprising a second semiconductor material different from the first semiconductor material, wherein the absorption structure comprises a first doping type; a vertical well region disposed within the substrate and underlying the absorption structure, wherein the vertical well region comprises a second doping type different from the first doping type; and a liner layer disposed between the absorption structure and the substrate, wherein the liner layer comprises the second semiconductor material and separates the vertical well region from the absorption structure. In an embodiment, a middle region of the liner layer directly between the vertical well region and the absorption structure is undoped. In an embodiment, the liner layer comprises a first doping concentration of the first doping type and the absorption structure comprises a second doping concentration greater than the first doping concentration. In an embodiment, the second doping concentration is at least ten times greater than the first doping concentration. In an embodiment, a doping concentration of the vertical well region is greater than or equal to the first doping concentration. In an embodiment, the liner layer meets the vertical well region at a PN junction. In an embodiment, the integrated chip further includes: a connection well region disposed in the substrate and laterally offset from the absorption structure; a lateral well region underlying the vertical well region and continuously extending from the vertical well region to the connection well region; and a first contact region overlying the lateral well region, wherein the connection well region, the lateral well region, and the first contact region comprise the second doping type. In an embodiment, when viewed from above the connection well region is ring shaped and continuously extends around an outer perimeter of the absorption structure.

In some embodiments, the present application provides an integrated chip including: a silicon substrate comprising opposing sidewalls and an upper surface defining a recess; a germanium structure disposed within the recess, wherein the germanium structure comprises a first doping type; a lateral well region disposed within the silicon substrate below the germanium structure, wherein the lateral well region comprises a second doping type opposite the first doping type; a vertical well region disposed in the silicon substrate and continuously extending from the lateral well region to the upper surface of the silicon substrate, wherein the vertical well region comprises the second doping type; and a germanium liner contacting the opposing sidewalls and the upper surface of the silicon substrate, wherein the germanium liner continuously extends from the vertical well region to a bottom surface of the germanium structure. In an embodiment, the integrated chip further includes: a contact region disposed in the germanium structure and the germanium liner; and a well region disposed within the germanium structure and the germanium liner, wherein the well region continuously extends from the contact region to the bottom surface of the germanium structure, wherein the contact region and the well region comprise the first doping type. In an embodiment, the well region is ring-shaped and continuously wraps around a middle region of the germanium structure, wherein a doping concentration of the contact region is greater than a doping concentration of the well region, and the doping concentration of the well region is greater than a doping concentration of the middle region of the germanium structure. In an embodiment, the contact region and the well region continuously extend to the opposing sidewalls of the silicon substrate. In an embodiment, the germanium liner comprises a first dopant and the germanium structure comprises a second dopant having a smaller atomic size than that of the first dopant. In an embodiment, the integrated chip further includes a capping layer continuously extending along a top surface of the germanium structure and a top surface of the germanium liner. In an embodiment, a top surface of the capping layer is coplanar with a top surface of the silicon substrate.

In some embodiments, the present application provides a method for forming an integrated chip, the method includes: performing a patterning process on a substrate to form opposing sidewalls and an upper surface in the substrate that define a recess, wherein the substrate comprises a first semiconductor material; doping the substrate to form a doped surface region along the sidewalls and upper surface of the substrate, wherein the doped surface region comprises a first doping type; doping the substrate to form a vertical well region extending from the upper surface of the substrate to a point below the doped surface region, wherein the vertical well region comprises a second doping type opposite the first doping type; forming a liner layer along the opposing sidewalls and the upper surface of the substrate, wherein the liner layer comprises a second semiconductor material different from the first semiconductor material; and forming an absorption structure within the recess and on the liner layer, wherein the absorption structure comprises the second semiconductor material and has the first doping type. In an embodiment, the method further includes: forming a lateral well region within a first semiconductor layer of the substrate; and forming a second semiconductor layer over the first semiconductor layer, wherein the second semiconductor layer is part of the substrate and the patterning process is performed on the second semiconductor layer; wherein the lateral well region underlies and abuts the vertical well region. In an embodiment, the method further includes: performing a planarization process on the absorption structure to remove excess material of the absorption structure from over the substrate; and forming a capping layer along top surfaces of the absorption structure and the liner layer, wherein the capping layer contacts the opposing sidewalls of the substrate. In an embodiment, the liner layer is formed by a first epitaxial process at a first temperature, wherein the absorption structure is formed by a second epitaxial process at a second temperature greater than the first temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a substrate comprising a first semiconductor material and a recess in a top surface of the substrate;
an absorption structure disposed within the recess and comprising a second semiconductor material different from the first semiconductor material, wherein the absorption structure comprises a first doping type;
a vertical well region disposed within the substrate and underlying the absorption structure, wherein the vertical well region comprises a second doping type different from the first doping type; and
a liner layer disposed between the absorption structure and the substrate, wherein the liner layer comprises the second semiconductor material and separates the vertical well region from the absorption structure.

2. The integrated chip of claim 1, wherein a middle region of the liner layer directly between the vertical well region and the absorption structure is undoped.

3. The integrated chip of claim 1, wherein the liner layer comprises a first doping concentration of the first doping type and the absorption structure comprises a second doping concentration greater than the first doping concentration.

4. The integrated chip of claim 3, wherein the second doping concentration is at least ten times greater than the first doping concentration.

5. The integrated chip of claim 3, wherein a doping concentration of the vertical well region is greater than or equal to the first doping concentration.

6. The integrated chip of claim 1, wherein the liner layer meets the vertical well region at a PN junction.

7. The integrated chip of claim 1, further comprising:
a connection well region disposed in the substrate and laterally offset from the absorption structure;
a lateral well region underlying the vertical well region and continuously extending from the vertical well region to the connection well region; and
a first contact region overlying the lateral well region, wherein the connection well region, the lateral well region, and the first contact region comprise the second doping type.

8. The integrated chip of claim 7, wherein when viewed from above the connection well region is ring shaped and continuously extends around an outer perimeter of the absorption structure.

9. The integrated chip of claim 1, further comprising:
a doped surface region disposed in the substrate and along the liner layer, wherein the doped surface region comprises the first doping type, wherein the vertical well region extends through the doped surface region to abut the liner layer, wherein the vertical well region abuts sides of the doped surface region.

10. An integrated chip, comprising:
a silicon substrate comprising opposing sidewalls and an upper surface defining a recess;
a germanium structure disposed within the recess, wherein the germanium structure comprises a first doping type;
a lateral well region disposed within the silicon substrate below the germanium structure, wherein the lateral well region comprises a second doping type opposite the first doping type;
a vertical well region disposed in the silicon substrate and continuously extending from the lateral well region to the upper surface of the silicon substrate, wherein the vertical well region comprises the second doping type; and
a germanium liner contacting the opposing sidewalls and the upper surface of the silicon substrate, wherein the germanium liner continuously extends from the vertical well region to a bottom surface of the germanium structure.

11. The integrated chip of claim 10, further comprising:
a contact region disposed in the germanium structure and the germanium liner; and
a well region disposed within the germanium structure and the germanium liner, wherein the well region continuously extends from the contact region to the bottom surface of the germanium structure, wherein the contact region and the well region comprise the first doping type.

12. The integrated chip of claim 11, wherein the well region is ring-shaped and continuously wraps around a middle region of the germanium structure, wherein a doping concentration of the contact region is greater than a doping concentration of the well region, and the doping concentration of the well region is greater than a doping concentration of the middle region of the germanium structure.

13. The integrated chip of claim 11, wherein the contact region and the well region continuously extend to the opposing sidewalls of the silicon substrate.

14. The integrated chip of claim 10, wherein the germanium liner comprises a first dopant and the germanium structure comprises a second dopant having a smaller atomic size than that of the first dopant.

15. The integrated chip of claim 10, further comprising:
    a capping layer continuously extending along a top surface of the germanium structure and a top surface of the germanium liner.

16. The integrated chip of claim 15, wherein a top surface of the capping layer is coplanar with a top surface of the silicon substrate.

17. A method for forming an integrated chip, comprising:
    performing a patterning process on a substrate to form opposing sidewalls and an upper surface in the substrate that define a recess, wherein the substrate comprises a first semiconductor material;
    doping the substrate to form a doped surface region along the sidewalls and upper surface of the substrate, wherein the doped surface region comprises a first doping type;
    doping the substrate to form a vertical well region extending from the upper surface of the substrate to a point below the doped surface region, wherein the vertical well region comprises a second doping type opposite the first doping type;
    forming a liner layer along the opposing sidewalls and the upper surface of the substrate, wherein the liner layer comprises a second semiconductor material different from the first semiconductor material; and
    forming an absorption structure within the recess and on the liner layer, wherein the absorption structure comprises the second semiconductor material and has the first doping type.

18. The method of claim 17, further comprising:
    forming a lateral well region within a first semiconductor layer of the substrate; and
    forming a second semiconductor layer over the first semiconductor layer, wherein the second semiconductor layer is part of the substrate and the patterning process is performed on the second semiconductor layer;
    wherein the lateral well region underlies and abuts the vertical well region.

19. The method of claim 17, further comprising:
    performing a planarization process on the absorption structure to remove excess material of the absorption structure from over the substrate; and
    forming a capping layer along top surfaces of the absorption structure and the liner layer, wherein the capping layer contacts the opposing sidewalls of the substrate.

20. The method of claim 17, wherein the liner layer is formed by a first epitaxial process at a first temperature, wherein the absorption structure is formed by a second epitaxial process at a second temperature greater than the first temperature.

* * * * *